(12) United States Patent
Kimata et al.

(10) Patent No.: US 10,209,303 B2
(45) Date of Patent: Feb. 19, 2019

(54) SIGNAL PROCESSING APPARATUS (71) Applicant: DENSO CORPORATION, Kariya, Aichi-pref (JP)

(72) Inventors: Tetsuya Kimata, Ichinomiya (JP); Akira Nakashima, Ichinomiya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 561 days.

(21) Appl. No.: 14/802,484

(22) Filed: Jul. 17, 2015

(65) Prior Publication Data
US 2016/0018463 A1    Jan. 21, 2016

(30) Foreign Application Priority Data

Jul. 18, 2014    (JP) .................. 2014-148156

(51) Int. Cl.
*G01R 31/317*    (2006.01)
*G01R 31/3177*    (2006.01)
*B60T 7/22*    (2006.01)

(52) U.S. Cl.
CPC ............ *G01R 31/3177* (2013.01); *B60T 7/22* (2013.01); *G01R 31/31703* (2013.01); *B60T 2201/022* (2013.01); *B60T 2270/406* (2013.01)

(58) Field of Classification Search
None
See application file for complete search history.

(56) References Cited

U.S. PATENT DOCUMENTS

2005/0060602 A1*  3/2005  Battaia ................ G06F 11/1008
                                                                714/5.11
2007/0050689 A1*  3/2007  Sasakura .......... G01R 31/31816
                                                                714/718

FOREIGN PATENT DOCUMENTS

JP          2013-219473          10/2013

OTHER PUBLICATIONS

Collision Avoidance System. (n.d.). In Wikipedia. Retrieved Jun. 6, 2018, from https://en.wikipedia.org/wiki/Collison_avoidance_system.*

* cited by examiner

*Primary Examiner* — Raj R Gupta
(74) *Attorney, Agent, or Firm* — Knobbe, Martens, Olson & Bear, LLP (57) ABSTRACT

A signal processing apparatus includes a recording unit, an operation unit, a processing unit and an abnormality detector. The recording unit records configuration data therein. The operation unit performs arithmetic and logical operations on an input signal and outputs an operation signal indicative of the result of the operations. The operation unit has a circuit configuration defined by the configuration data recorded in the recording unit. The processing unit acquires the operation signal outputted from the operation unit, produces an output signal based on the acquired operation signal and outputs the produced output signal. The abnormality detector detects an abnormality of the circuit configuration of the operation unit. Moreover, in the signal processing apparatus, the processing unit is configured to further acquire an abnormality detection result from the abnormality detector after the acquisition of the operation signal and output the output signal depending on the abnormality detection result.

12 Claims, 5 Drawing Sheets

SIGNAL PROCESSING APPARATUS

CROSS-REFERENCE TO RELATED APPLICATION

This application is based on and claims priority from Japanese Patent Application No. 2014-148156 filed on Jul. 18, 2014, the content of which is hereby incorporated by reference in its entirety into this application.

BACKGROUND

1. Technical Field

The present invention relates to techniques for performing signal processing using programmable semiconductor devices.

2. Description of the Related Art

Conventionally, there have been known techniques for performing, using programmable semiconductor devices whose circuit configurations are defined by configuration data, signal processing that realizes various functions.

However, in the programmable semiconductor devices, due to soft errors caused by, for example, cosmic rays, there may occur such a phenomenon that data recorded in memory elements of the programmable semiconductor devices are logically inverted, i.e., changed from 1 to 0 or from 0 to 1. Consequently, data that contains errors may be outputted from the programmable semiconductor devices.

To suppress data that contains errors from being outputted from the programmable semiconductor devices, it is preferable to configure the programmable semiconductor devices to have redundancy. For example, Japanese Patent Application Publication No. JP2013219473A discloses a programmable logic device which includes first and second logic blocks that severally perform the same data processing. The programmable logic device determines whether first data produced by the first logic block and second data produced by the second logic block contain errors and outputs only one of the first data and the second data which is determined as containing no errors.

However, configuring the programmable semiconductor devices or systems employing them to have redundancy may result in increase in space, weight and cost. Moreover, configuring the programmable semiconductor devices or systems employing them to have redundancy may also result in increase in electrical power consumption and the internal temperatures of the devices or systems and thus result in decrease in the maximum allowable operating temperatures of the devices or systems. On the other hand, without redundancy, the programmable semiconductor devices or systems employing them may output data that contains errors, as described previously.

SUMMARY

According to one exemplary embodiment, there is provided a signal processing apparatus which includes: (1) recording means for recording configuration data therein; (2) operation means for performing arithmetic and logical operations on an input signal and outputting an operation signal indicative of a result of the operations, the operation means having a circuit configuration defined by the configuration data recorded in the recording means; (3) processing means for acquiring the operation signal outputted from the operation means, producing an output signal based on the acquired operation signal and outputting the produced output signal; and (4) abnormality detection means for detecting an abnormality of the circuit configuration of the operation means. Moreover, the processing means is configured to further acquire an abnormality detection result from the abnormality detection means after the acquisition of the operation signal and output the output signal depending on the abnormality detection result.

Consequently, when an abnormality of the circuit configuration of the operation means has occurred, it is possible to prevent the output signal that contains errors from being outputted from the processing means. As a result, it becomes possible to prevent data that contains errors from being outputted from the signal processing apparatus without configuring the signal processing apparatus to have redundancy.

In further implementations, the processing means may output, after a preset waiting time from the acquisition of the operation signal, the output signal depending on the abnormality detection result. The waiting time may be preset according to the length of time from occurrence of the abnormality of the circuit configuration of the operation means until the abnormality is detected by the abnormality detection means.

Further, the configuration data may be comprised of a plurality of data blocks. The operation means may include configuration recording means for recording therein the configuration data, which is recorded in the recording means, on a data block basis. The abnormality detection means may perform, for each of the data blocks of the configuration data recorded in the configuration recording means, a data block-based abnormality detection to detect whether an abnormality has occurred in the data block. Upon detection of the abnormality in any of the data blocks of the configuration data, the abnormality detection means may determine that the abnormality of the circuit configuration of the operation means has occurred. The waiting time may be preset to be longer than or equal to a required detection time which is a time required for the abnormality detection means to perform the data block-based abnormality detection for a predetermined number of the data blocks of the configuration data recorded in the configuration recording means.

Furthermore, it is preferable that the required detection time is a time required for the abnormality detection means to perform the data block-based abnormality detection for all the data blocks of the configuration data recorded in the configuration recording means.

The processing means may be configured not to output the output signal when the abnormality detection result indicates that the abnormality of the circuit configuration of the operation means has been detected by the abnormality detection means.

The signal processing apparatus may be configured to control a target device. In this case, when the abnormality detection result indicates that no abnormality of the circuit configuration of the operation means has been detected by the abnormality detection means, the processing means may output a target control signal for controlling the target device as the output signal to the target device. On the other hand, when the abnormality detection result indicates that the abnormality of the circuit configuration of the operation means has been detected by the abnormality detection means, the processing means may output an abnormality signal as the output signal to the target device.

Further, in the above case, the target control signal and the abnormality signal may be produced by the processing means according to the likelihood of the operation signal outputted from the operation means being correct.

The operation means may be constituted of a programmable logic device that includes a configuration recording section for recording the configuration data and is capable of rewriting the configuration data recorded in the configuration recording section.

The abnormality detection means may be included in the operation means. In this case, it is preferable that at least two of the operation means, the processing means and the recording means are provided together on a single chip. It is more preferable that all of the operation means, the processing means and the recording means are provided together on the single chip.

BRIEF DESCRIPTION OF THE DRAWINGS

The present invention will be understood more fully from the detailed description given hereinafter and from the accompanying drawings of one exemplary embodiment, which, however, should not be taken to limit the invention to the specific embodiment but are for the purpose of explanation and understanding only.

In the accompanying drawings.

DESCRIPTION OF EMBODIMENT

Figure 1:
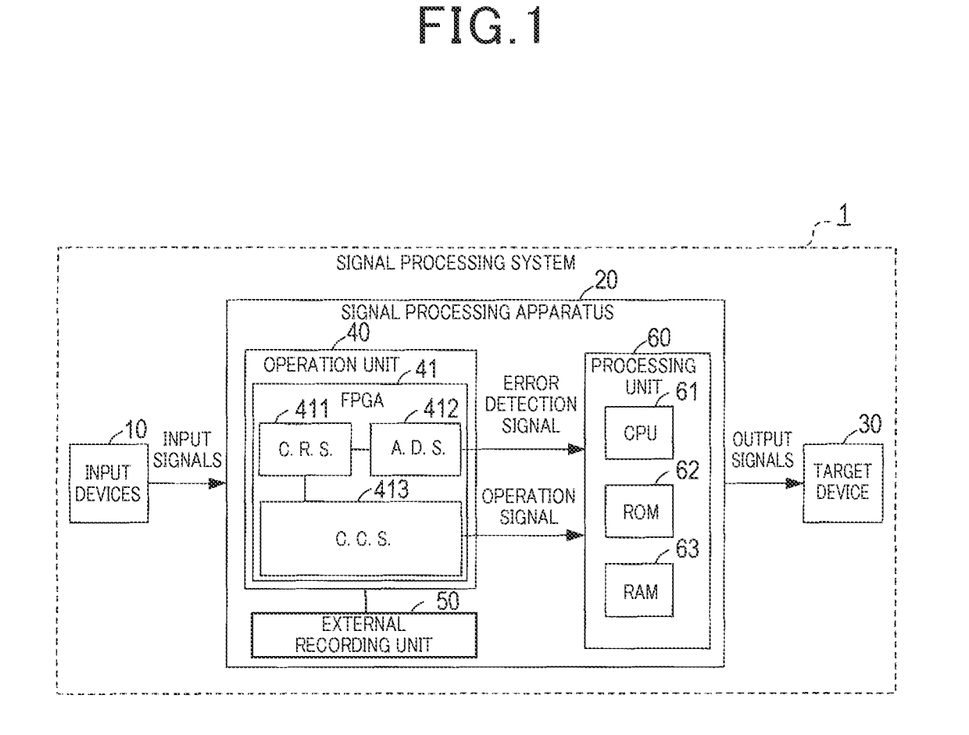
FIG. 1 is a functional block diagram illustrating the overall configuration of a signal processing system which includes a signal processing apparatus according to an embodiment.

FIG. 1 shows the overall configuration of a signal processing system 1 which includes a signal processing apparatus 20 according to an embodiment.

As shown in FIG. 1, the signal processing system 1 further includes an input device 10 and a target device 30, both of which are communicably connected with the signal processing apparatus 20. Specifically, the signal processing apparatus 20 receives an input signal outputted from the input device 10, produces an output signal based on the received input signal, and outputs the produced output signal to the target device 30. Here, the target device 30 is a control target that is controlled in accordance with the output signal outputted from the signal processing apparatus 20.

In addition, in the present embodiment, the signal processing system 1 is configured as, for example, a brake control system for a vehicle. The input device 10 is configured as, for example, an in-vehicle camera that captures images of an environment of the vehicle (e.g., an area in front of the vehicle). The signal processing apparatus 20 is configured as, for example, a brake control apparatus. The target device 30 is configured as, for example, a brake mechanism of the vehicle.

The signal processing apparatus 20 includes an operation unit 40, an external recording unit 50 and a processing unit 60. In the present embodiment, all of the operation unit 40, the external recording unit 50 and the processing unit 60 are provided together on, for example, a single PCB (Printed Circuit Board). In this case, the solid-line rectangle bearing the reference numeral 20 in FIG. 1 represents the PCB.

In addition, two or all of the operation unit 40, the external recording unit 50 and the processing unit 60 may be alternatively provided together on a single chip. In this case, the solid-line rectangle bearing the reference numeral 20 in FIG. 1 represents the chip.

In the present embodiment, the operation unit 40 is constituted of a Field-Programmable Gate Array (FPGA) 41. The FPGA 41 is a type of Programmable Logic Device (PLD) whose circuit configuration is defined by configuration data. The FPGA 41 includes a configuration recording section (abbreviated to C. R. S. in FIG. 1) 411, an abnormality detection section (abbreviated to A. D. S. in FIG. 1) 412 and a circuit configuration section (abbreviated to C. C. S. in FIG. 1) 413.

The configuration recording section 411 records configuration data therein. The circuit configuration section 413 includes a plurality of logic cells. The circuit configuration section 413 is configured to combine the logic cells according to the configuration data recorded in the configuration recording section 411, thereby realizing various circuit functions. The abnormality detection section 412 is configured to detect whether errors due to, for example, soft errors have occurred in the configuration data recorded in the configuration recording section 411. The abnormality detection section 412 is provided in the FPGA 41 separately from the circuit configuration section 413.

The FPGA 41 outputs an operation signal to the processing unit 60. The operation signal is obtained as a result of arithmetic and logical operations performed by the circuit configuration section 413 on the input signal. In other words, the operation signal is indicative of the result of operations performed by the circuit configuration section 413 on the input signal. Moreover, the FPGA 41 also outputs an error detection signal to the processing unit 60. The error detection signal is indicative of the result of the detection of errors in the configuration data by the abnormality detection section 412.

The external recording unit 50 is a recording device which has the configuration data previously recorded therein. The external recording unit 50 includes a nonvolatile memory such as a flash memory or an EEPROM (Electrically Erasable Programmable Read-Only Memory).

Next, functions of the FPGA 41 will be described.

First, the FPGA 41 has a function of reading out, according to a download command from the processing unit 60, the configuration data recorded in the external recording unit 50 and recording the read-out configuration data into the configuration recording section 411 of the FPGA 41.

Specifically, in the present embodiment, the FPGA 41 reads out the configuration data from the external recording unit 50 on a frame (or data block) basis; each frame contains a predetermined length (e.g., n bits) of data. Further, the FPGA 41 adds ECC data (e.g., k bits), which is encoded by an Error-Correcting Code (ECC), to each read-out frame of the configuration data. Then, the FPGA 41 sequentially records each ECC data-added frame (i.e., (n+k) bits) of the configuration data in the configuration recording section 411. In addition, a Hamming code or a cyclic code may be used as the ECC code.

Secondly, the FPGA 41 has an error detection function that is realized by the abnormality detection section 412. Here, the error detection function denotes a function of detecting errors in the configuration data recorded in the configuration recording section 411.

Specifically, in the present embodiment, the abnormality detection section 412 of the FPGA 41 repeats, in a predetermined cycle, the processes of: reading in each frame of the configuration data recorded in the configuration recording section 411 and the ECC data added to the frame; performing a predetermined operation on each frame of the configuration data and the ECC data added to the frame; and outputting a logical value 1 as the error detection signal when the result of the predetermined operation indicates that errors have occurred in the frame of the configuration data.

Since the abnormality detection section 412 repeatedly performs the predetermined operation on each frame of the configuration data recorded in the configuration recording section 411, it takes time to complete the performance of the predetermined operation on all the configuration data. Hereinafter, the time required for the abnormality detection section 412 to perform the predetermined operation on all the frames of the configuration data will be referred to as the maximum required detection time.

The processing unit 60 includes a microcomputer of a well-kwon type, which includes a CPU (Central Processing Unit) 61, a ROM (Read Only Memory) 62 and a RAM (Random Access Memory) 63. The processing unit 60 is configured to perform predetermined processes in accordance with a program installed in the ROM 62. For example, the predetermined processes include: a process of outputting the download command to the operation unit 40 and thereby causing the operation unit 40 to read in the configuration data; and a signal output process for outputting the output signal to the target device 30.

Next, the signal output process performed by the processing unit 60 (more specifically, by the CPU 61) will be described in detail with reference to FIG. 2. It should be noted that the signal output process is repeatedly performed as long as the signal processing system 1 is activated.

First, at step S10, the processing unit 60 determines whether the operation signal has been outputted from the operation unit 40 (more specifically, from the circuit configuration section 413 of the FPGA 41).

If the determination at step S10 results in a "NO" answer, the processing unit 60 waits until the operation signal is outputted from the operation unit 40.

In contrast, if the determination at step S10 results in a "YES" answer, the process proceeds to step S20.

At step S20, the processing unit 60 acquires (or receives) the operation signal outputted from the operation unit 40.

At step S30, the processing unit 60 further determines whether the elapsed time from the acquisition of the operation signal at step S20 is longer than or equal to a preset waiting time.

In addition, the waiting time is preset according to the length of time from occurrence of errors in the configuration data until the error detection signal, which is indicative of the detection of the errors by the abnormality detection section 412, is outputted from the operation unit 40. More particularly, in the present embodiment, the waiting time is preset so as to be longer than or equal to the maximum required detection time.

If the determination at step S30 results in a "NO" answer, the processing unit 60 waits until the elapsed time becomes longer than or equal to the preset waiting time.

In contrast, if the determination at step S30 results in a "YES" answer, the process proceeds to step S40.

At step S40, the processing unit 60 further determines whether errors have occurred in the configuration data. More specifically, at this step, the processing unit 60 acquires the error detection signal outputted from the operation unit 40 (more specifically, from the abnormality detection section 412 of the FPGA 41) and determines whether the error detection signal is equal to the logical value 1 or 0.

If the determination at step S40 results in a "NO" answer, i.e., if the error detection signal is equal to the logical value 0, the process proceeds to step S50.

At step S50, the processing unit 60 processes the operation signal outputted from the operation unit 40 to produce a target control signal for controlling the target device 30. More specifically, at this step, the processing unit 60 produces the target control signal by performing predetermined operations based on the operation signal outputted from the operation unit 40.

At subsequent step S60, the processing unit 60 outputs the target control signal as the output signal to the target device 30. Then, the process returns to step S10.

On the other hand, if the determination at step S40 results in a "YES" answer, i.e., if the error detection signal is equal to the logical value 1, the process proceeds to step S70.

At step S70, the processing unit 60 produces an error signal indicative of that errors have occurred in the configuration data and thus the operation signal outputted from the operation unit 40 is erroneous.

In addition, in the present embodiment, the processing unit 60 produces the error signal so as to indicate that the signal processing apparatus 20 is in a state of not outputting the target control signal. More specifically, the processing unit 60 produces the error signal as, for example, a signal where the logical value 0 is maintained for a given duration.

At subsequent step S80, the processing unit 60 outputs the error signal as the output signal to the target device 30. Then, the process returns to step S10.

Figure 3:
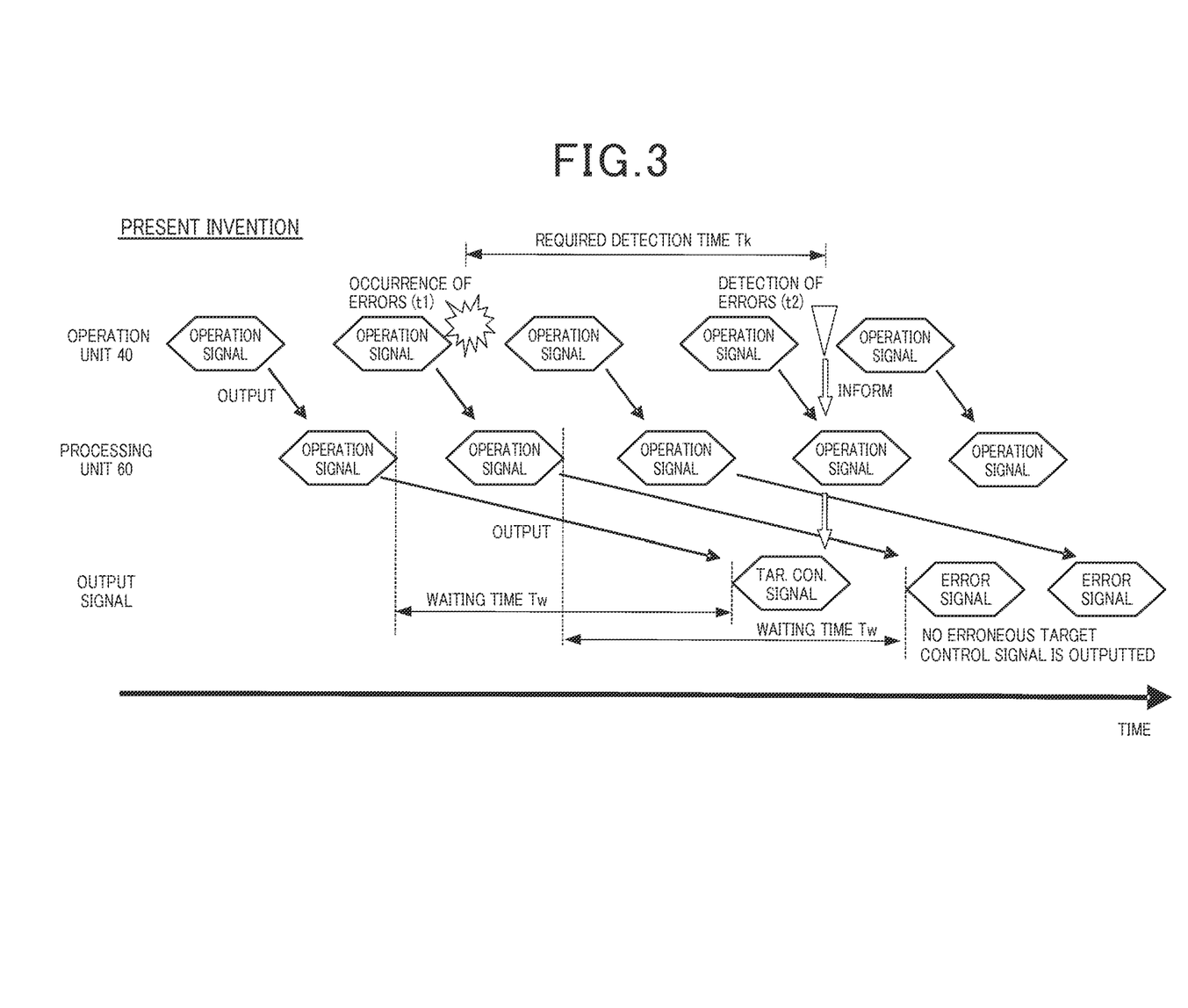
FIG. 3 is a schematic view illustrating advantages of the signal processing apparatus according to the embodiment.

Next, operation of the signal processing apparatus 20 according to the present embodiment will be described with reference to FIG. 3.

In the signal processing apparatus 20, upon occurrence of errors in the configuration data at, for example, a time instant t1 during operation of the signal processing system 1, the error detection signal is outputted from the abnormality detection section 412 of the operation unit 40 to the processing unit 60 at a time instant t2 after a required detection time Tk from the time instant t1.

As described previously, in the present embodiment, the configuration data is recorded in the configuration recording section 411 of the operation unit 40 in a frame basis. Moreover, the abnormality detection section 412 of the operation unit 40 performs the error detection also in a frame basis. In other words, the abnormality detection section 412 sequentially performs the error detection for each frame of the configuration data recorded in the configuration recording section 411. Therefore, the required detection time Tk varies depending on the location in the configuration data where the errors have occurred and the frame of the configuration data for which the abnormality detection section 412 was performing the frame-based error detection at the time of occurrence of the errors.

The processing unit 60 outputs, after the preset waiting time Tw from the acquisition of the operation signal outputted from the operation unit 40, either the target control signal or the error signal as the output signal to the target device 30 according to the error detection result indicated by the error detection signal. Therefore, upon occurrence of the errors in the configuration data, the processing unit 60 outputs the error signal instead of the target control signal that is produced based on the erroneous operation signal outputted from the operation unit 40. Consequently, it is possible to prevent the erroneous target control signal from being outputted to the target device 30 while continuing operation of the signal processing system 1.

According to the present embodiment, it is possible to achieve the following advantageous effects.

(1) In the present embodiment, the processing unit 60 is configured to further acquire the error detection signal outputted from the abnormality detection section 412 after the acquisition of the operation signal and output the output signal depending on the error detection result indicated by the error detection signal. More specifically, in the present embodiment, the processing unit 60 is configured to output, after the preset waiting time Tw from the acquisition of the operation signal, either the target control signal or the error signal as the output signal to the target device 30 according to the error detection result indicated by the error detection signal. As described previously, the waiting time Tw is preset according to the length of time from occurrence of errors in the configuration data until the error detection signal, which is indicative of the detection of the errors by the abnormality detection section 412, is outputted from the operation unit 40. Consequently, when errors have occurred in the configuration data recorded in the configuration recording section 411, in other words, when an abnormality of the circuit configuration of the operation unit 40 has occurred, the target control signal that contains errors is prevented from being outputted from the processing unit 60. As a result, it becomes possible to prevent data that contains errors from being outputted from the signal processing apparatus 20 to the target device 30 without configuring the signal processing apparatus 20 to have redundancy.

Figure 4:
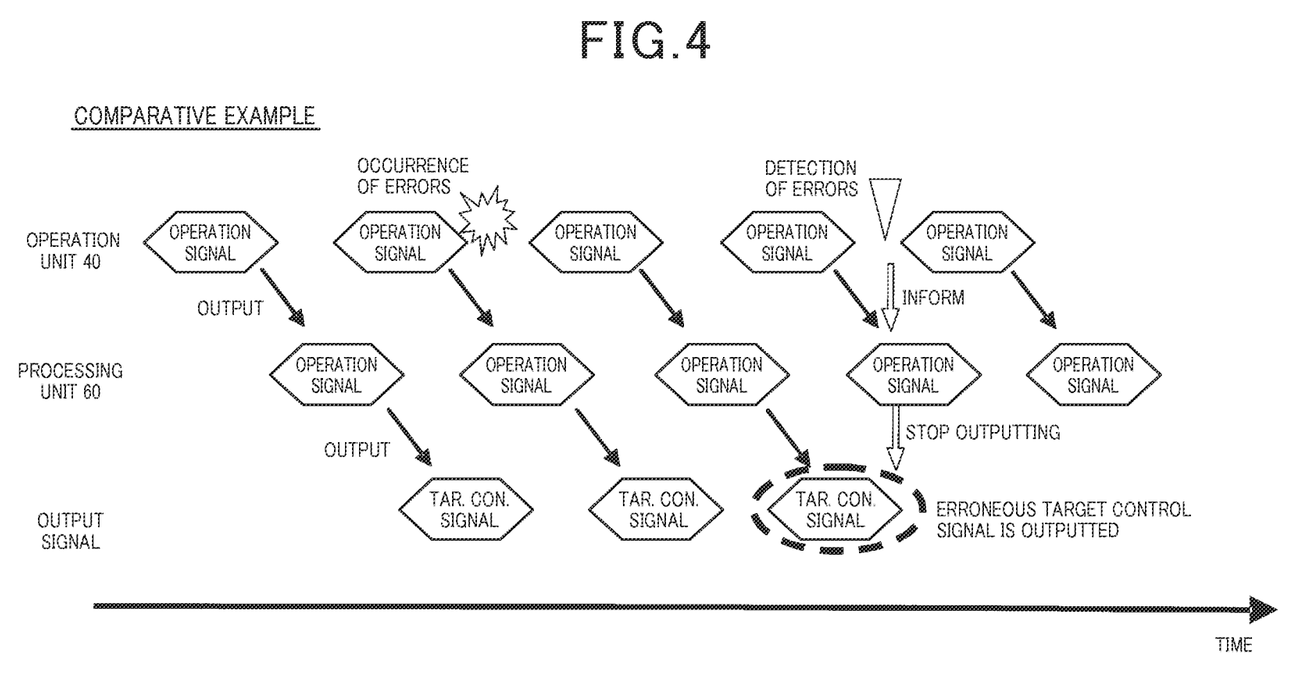
FIG. 4 is a schematic view illustrating disadvantages of a signal processing apparatus according to a comparative example.

In contrast, in a comparative example shown in FIG. 4, the processing unit 60 outputs the target control signal without waiting for a preset waiting time from the acquisition of the operation signal. Moreover, the processing unit 60 stops outputting the target control signal only upon receipt of the error detection signal which indicates that errors have occurred in the configuration data. Consequently, the target control signal that contains errors may be outputted to the target device 30 before the processing unit 60 stops outputting the target control signal upon receipt of the error detection signal. This is because the length of time from occurrence of errors in the configuration data until the error detection signal, which is indicative of the detection of the errors by the abnormality detection section 412, is acquired by the processing unit 60 is considerably longer than the length of time required for the processing unit 60 to produce the target control signal based on the operation signal.

(2) In the present embodiment, the configuration data is comprised of the plurality of frames (or data blocks) and recorded in the configuration recording section 411 in a frame basis (or a data block basis). The abnormality detection section 412 performs, for each of the frames of the configuration data recorded in the configuration recording section 411, the frame-based error detection to detect whether errors have occurred in the frame. Upon detection of errors in any of the frames of the configuration data, the abnormality detection section 412 determines that an abnormality of the circuit configuration of the operation unit 40 has occurred. The waiting time Tw is preset to be longer than or equal to the maximum required detection time, i.e., the time required for the abnormality detection section 412 to perform the frame-based error detection for all the frames of the configuration data. Consequently, the processing unit 60 outputs the output signal depending on the error detection result indicated by the error detection signal only after the frame-based error detection has been performed by the abnormality detection section 412 for all the frames of the configuration data. As a result, it is possible to more reliably prevent the target control signal that contains errors from being outputted from the signal processing apparatus 20 to the target device 30.

(3) In the present embodiment, when no errors in the configuration data have been detected by the abnormality detection section 412, in other words, when no abnormality of the circuit configuration of the operation unit 40 has been detected by the abnormality detection section 412, the processing unit 60 outputs the target control signal as the output signal. On the other hand, when errors in the configuration data have been detected by the abnormality detection section 412, in other words, when an abnormality of the circuit configuration of the operation unit 40 has been detected by the abnormality detection section 412, the processing unit 60 outputs the error signal as the output signal. The error signal is indicative of occurrence of the errors in the configuration data, in other words, indicative of occurrence of the abnormality of the circuit configuration of the operation unit 40. Consequently, it is possible for the signal processing apparatus 20 to more safely and reliably control the target device 30. In addition, as described previously, in the present embodiment, the target device 30 is configured as a brake mechanism of a vehicle; and the signal processing apparatus 20 is configured as a brake control apparatus to control the brake mechanism.

(4) In the present embodiment, when errors in the configuration data have been detected by the abnormality detection section 412, in other words, when an abnormality of the circuit configuration of the operation unit 40 has been detected by the abnormality detection section 412, the processing unit 60 does not output the target control signal. Instead, the processing unit 60 outputs the error signal indicating that the signal processing apparatus 20 is in a state of not outputting the target control signal. Consequently, it is possible to prevent the target control signal that contains errors from being outputted to the target device 30.

(5) In the present embodiment, the operation unit 40 is constituted of the FPGA 41 that includes the configuration recording section 411 for recording the configuration data and is capable of rewriting the configuration data recorded in the configuration recording section 411. Consequently, it is possible to realize various functions of the operation unit 40.

In addition, in the present embodiment, the operation unit 40 is an example of operation means for performing arithmetic and logical operations on the input signal and outputting the operation signal indicative of the result of the operations. The external recording unit 50 is an example of recording means for recording the configuration data. The processing unit 60 is an example of processing means for acquiring the operation signal outputted from the operation means, producing the output signal based on the acquired operation signal and outputting the produced output signal. The abnormality detection section 412 of the FPGA 41 is an example of abnormality detection means for detecting an abnormality of the circuit configuration of the operation means. The configuration recording section 411 of the FPGA 41 is an example of configuration recording means included in the operation means. The FPGA 41 is an example of a programmable logic device. The error signal is an example of an abnormality signal outputted by the processing means. The frame-based error detection performed by the abnormality detection section 412 of the FPGA 41 is an example of a data block-based abnormality detection performed by the abnormality detection means.

While the above particular embodiment has been shown and described, it will be understood by those skilled in the art that various modifications, changes, and improvements may be made without departing from the spirit of the present invention.

[First Modification]

Figure 2:
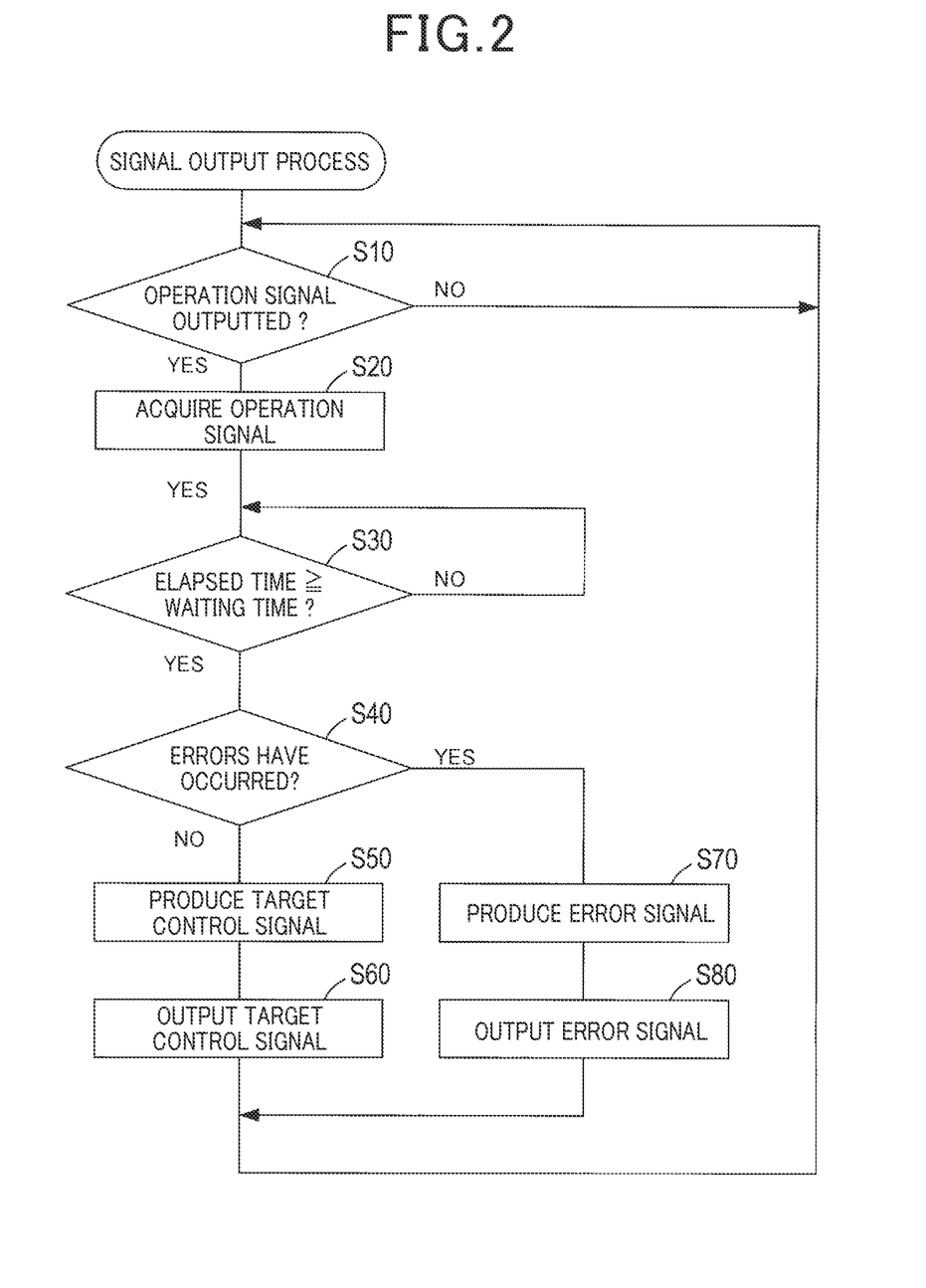
FIG. 2 is a flow chart illustrating a signal output process performed by a processing unit of the signal processing apparatus according to the embodiment.

In the above-described embodiment, the processing unit 60 produces the target control signal by performing predetermined operations based on the operation signal outputted from the operation unit 40 (see step S50 of FIG. 2). However, the processing unit 60 may output a signal identical to the operation signal as the target control signal. In other words, the processing unit 60 may produce the target control signal so as to be identical to the operation signal.

Moreover, in the above-described embodiment, when errors have occurred in the configuration data, the processing unit 60 produces the error signal and outputs the produced error signal as the output signal (see steps S70 and S80 of FIG. 2). However, the processing unit 60 may be configured not to output the output signal when errors have occurred in the configuration data. In other words, steps S70 and S80 may be omitted from the signal output process shown in FIG. 2.

[Second Modification]

In the above-described embodiment, when no errors have occurred in the configuration data, the processing unit 60 produces the target control signal by performing predetermined operations based on the operation signal outputted from the operation unit 40. Then, the processing unit 60 outputs the produced target control signal as the output signal to the target device 30. On the other hand, when errors have occurred in the configuration data, the processing unit 60 produces the error signal indicative of that the operation signal outputted from the operation unit 40 is erroneous. Then, the processing unit 60 outputs the produced error signal as the output signal to the target device 30 (see steps S40-S80 of FIG. 2).

However, the processing unit 60 may produce the output signal (i.e., the target control signal and the error signal) according to the likelihood of the operation signal outputted from the operation unit 40 being correct.

Specifically, referring again to FIG. 1, the input device 10, which is configured as an in-vehicle camera, captures an image of an area in front of the vehicle and outputs the input signal indicative of the captured image. The operation unit 40 produces, based on the input signal, the operation signal indicative of the presence of a pedestrian in the area in front of the vehicle. Moreover, referring further to FIG. 2, when the error detection signal indicates that no errors have occurred in the configuration data (S40: NO), there is a high likelihood of the operation signal outputted from the operation unit 40 being correct. Therefore, the processing unit 60 produces, at step S50, the target control signal as a signal for activating the target device 30 that is configured as a brake mechanism. Then, at step S60, the processing unit 60 outputs the target control signal as the output signal to the target device 30. On the other hand, when the error detection signal indicates that errors have occurred in the configuration data (S40: YES), there is only a low likelihood of the operation signal outputted from the operation unit 40 being correct. Therefore, the processing unit 60 produces, at step S70, the error signal as a signal for increasing the hydraulic pressure of the brake mechanism (i.e., the target device 30) and thereby making the brake mechanism ready for operation. Then, at step S80, the processing unit 60 outputs the error signal as the output signal to the target device 30. Consequently, it becomes possible to suitably control the target device 30 according to the likelihood of the operation signal being correct.

[Third Modification]

In the above-described embodiment, the operation unit 40 is constituted of the FPGA 41. However, the operation unit 40 may also be constituted of programmable logic devices other than the FPGA 41.

For example, the operation unit 40 may be constituted of a Field-Programmable Analog Array (FPAA). The FPAA is an integrated device which includes circuit elements, such as an analog operational amplifier, a resistor and a capacitor, and has an analog circuit that is reconfigurable according to specifying data.

Moreover, the operation unit 40 may be constituted of a dynamic reconfigurable device whose circuit configuration can be altered during operation.

Furthermore, the operation unit 40 may be constituted of a programmable logic device whose circuit configuration can be altered in a LUT (Look-Up Table) basis, in an ALU (Arithmetic Logic Unit) basis or in a PE (Processing Element) basis.

[Fourth Modification]

In the above-described embodiment, the waiting time Tw is preset to be longer than or equal to the maximum required detection time, i.e., the time required for the abnormality detection section 412 to perform the frame-based error detection for all the frames of the configuration data.

However, the waiting time Tw may also be preset to be longer than or equal to the time required for the abnormality detection section 412 to perform the frame-based error detection for only predetermined frames (e.g., frames that define a predetermined circuit configuration) among all the frames of the configuration data.

[Fifth Modification]

In the above-described embodiment, the signal processing apparatus 20 is used in the brake control system (i.e., the signal processing system 1) to function as the brake control apparatus to control the brake mechanism (i.e., the target device 30) of the vehicle. However, the signal processing apparatus 20 may also be used in various other systems to perform various other functions.

Figure 5:
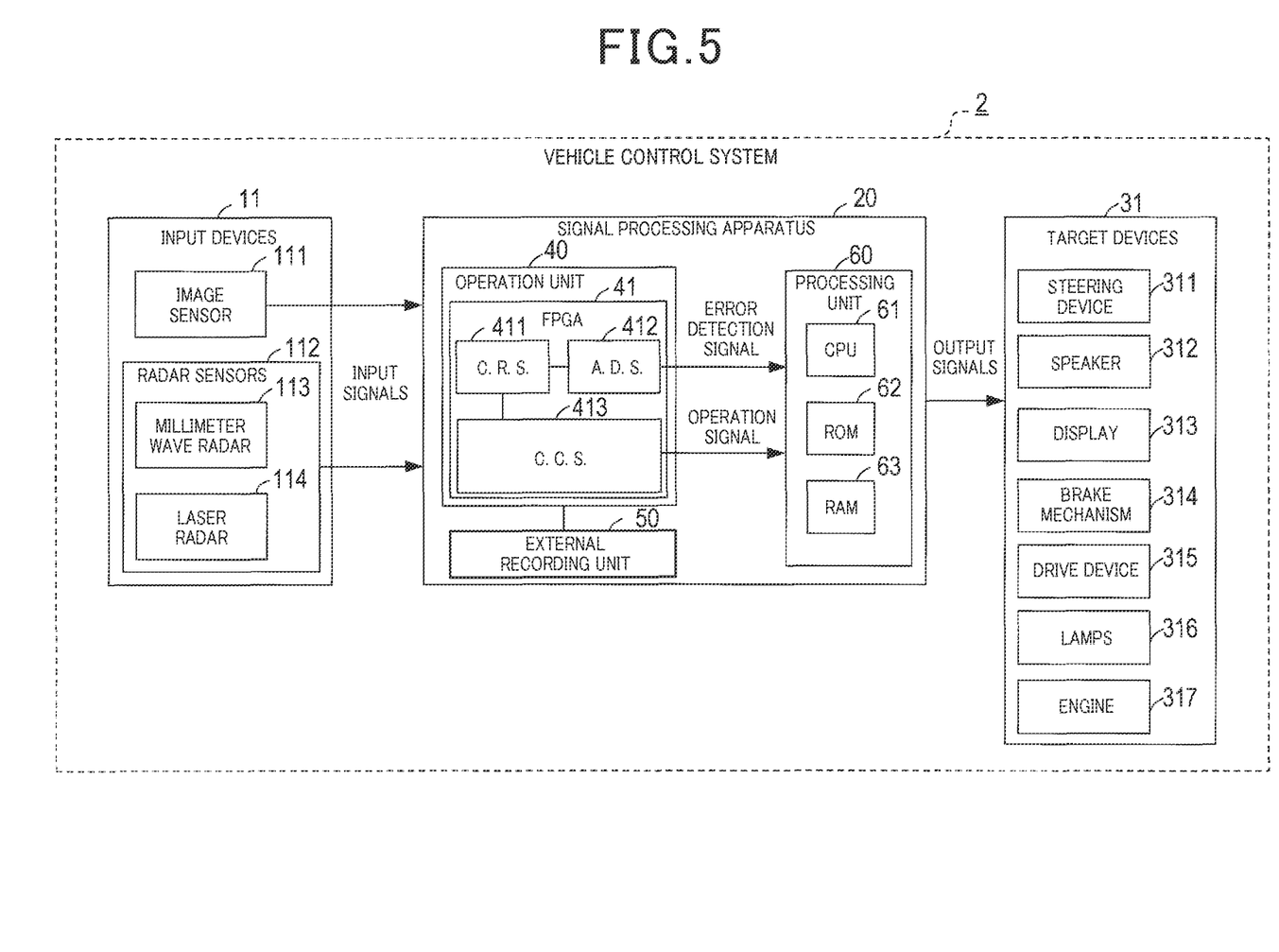
FIG. 5 is a functional block diagram illustrating the overall configuration of a vehicle control system to which the signal processing apparatus according to the embodiment is applied.

For example, the signal processing apparatus 20 may be used in a vehicle control system 2 as shown in FIG. 5.

The vehicle control system 2 performs various vehicle controls including, for example, a steering control, an engine control, a vehicle lamp control, a LDW (Lane Departure Warning) control, a collision avoidance control and various warning controls. In addition, the various warning controls include, for example, a speed warning control, a rear-end collision warning control and an inter-vehicle distance warning control.

The vehicle control system 2 includes a plurality of input devices 11 and a plurality of target devices 31 in addition to the signal processing apparatus 20.

The input devices 11 are provided to detect various objects present around the vehicle. The input devices 11 include, for example, an image sensor 111 and radar sensors 112. Moreover, the radar sensors 112 include, for example, a millimeter wave radar 113 and a laser radar 114.

The target devices 31 include, for example, a steering device (e.g., an electric power steering) 311, a speaker 312, a display 313, a brake mechanism 314, a drive device (e.g., an accelerator) 315, lamps 316, and an engine 317.

The signal processing apparatus 20 receives input signals outputted from the input devices 11, produces output signals based on the received input signals, and outputs the produced output signals to the target devices 31. In addition, the input signals are indicative of the detection results of the input devices 11. The output signals are used to control the target devices 31.

In addition, though not shown in the figures, the signal processing apparatus 20 may be configured to have one operation unit 40 for each input device 11. Specifically, the signal processing apparatus 20 may have a first operation unit 40 and two second operation units 40. The first operation unit 40 receives a first input signal that is outputted from the image sensor 111 and indicative of the images captured by the image sensor 111. Then, the first operation unit 40 produces a first operation signal by performing arithmetic and logical operations on the first input signal and outputs the produced first operation signal to the processing unit 60. On the other hand, the second operation units 40 respectively receive two second input signals that are respectively outputted from the radar sensors 112 and indicative of information captured by the radar sensors 112. Then, the second operation units 40 respectively produce two second operation signals by performing arithmetic and logical operations on the second input signals and output the produced second operation signals to the processing unit 60.

In addition, the images captured by the image sensor 111 indicate, for example, the position, height and lateral width of an object. On the other hand, the information captured by the radar sensors 112 indicates, for example, the distance from the vehicle to an object and the relative speed of the object to the vehicle. Moreover, the objects detected by the image sensor 111 and the radar sensors 112 include, for example, a preceding vehicle, a preceding pedestrian, a stationary vehicle, a stationary pedestrian, an oncoming vehicle, an oncoming pedestrian, lane boundary lines, road signs and traffic lights.

Furthermore, though not shown in the figures, the image sensor 111 and the first operation unit 40 may be integrally formed into one device. Each of the radar sensors 112 and a corresponding one of the second operation units 40 may be integrally formed into one device.

Moreover, the integrally-formed pairs of the input devices 11 and the operation units 40 may be arranged in a high-temperature environment in the vehicle. For example, the integrally-formed pair of the image sensor 111 and the first operation unit 40 may be arranged in the vicinity of a rear-view mirror fixed to the front window in the passenger compartment. On the other hand, the integrally-formed pairs of the radar sensors 112 and the second operation units 40 may be arranged in a front part of the engine compartment where the engine 317 is received.

As described previously, the signal processing apparatus 20 is configured not to have redundancy. Thus, the first and second operation units 40 have no redundancy. Therefore, during operation, the first and second operation units 40 consume less electric power and generate less heat than a conventional operation unit having redundancy. Consequently, the internal temperatures of the first and second operation units 40 increase less than the internal temperature of the conventional operation unit. As a result, decrease in the maximum allowable operating temperatures of the first and second operation units 40 due to the increase in the internal temperatures thereof is suppressed. Accordingly, the first and second operation units 40 are allowed to be arranged in a high-temperature environment in the vehicle as described above.

[Sixth Modification]

A function performed by one component in the above-described embodiment may also be performed by a plurality of components. In contrast, functions respectively performed by a plurality of components in the above-described embodiment may also be performed by a single component. Moreover, at least part of the configuration of the signal processing apparatus 20 according to the above-described embodiment may be replaced with a well-known configuration having the same function. Furthermore, part of the configuration of the signal processing apparatus 20 according to the above-described embodiment may be omitted to the extent that it is possible for the signal processing apparatus 20 to solve the technical problems described in the "Description of the Related Art" section. In contrast, a configuration providing an additional function may be added to the configuration of the signal processing apparatus 20 according to the above-described embodiment.

[Seventh Modification]

In the above-described embodiment, the present invention is embodied as the signal processing apparatus 20. However, the present invention may also be embodied as a method of controlling the signal processing apparatus 20, a computer program for controlling the signal processing apparatus 20 or a medium on which the computer program is stored.

What is claimed is:

1. A vehicle control system for controlling a vehicle to provide a vehicle control based on objects detected in an environment of the vehicle, the control system comprising:
one or more vehicle control devices mounted on the vehicle and configured to receive an output signal and perform the vehicle control based on the output signal;
one or more sensors mounted on the vehicle and configured to detect an object in the environment of the vehicle and generate an input signal based on the object detected;
a signal processing apparatus configured to receive the input signal based on the object detected and produce the output signal for performing the vehicle control, the signal processing apparatus comprising:
a recording means for recording configuration data therein;
an operation means for performing arithmetic and logical operations on the input signal based on the object detected and outputting an operation signal indicative of a result of the operations, the operation means having a circuit configuration defined by the configuration data recorded in the recording means;
an abnormality detection means for detecting an abnormality of the operation means and outputting an abnormality detection result, the abnormality detection means having a maximum required detection time that is less than a preset waiting time;
a processing means for acquiring the operation signal outputted from the operation means and acquiring the abnormality detection result from the abnormality detection means, the processing means producing the output signal based on the operation signal and outputting the output signal after the preset waiting time from the acquisition of the operation signal such that an abnormality of the operation means is detected by the abnormality detection means before the processing means outputs an output signal based on the abnormality of the operation means,
wherein in response to detecting an abnormality of the operation means, the processing means prevents a target vehicle control signal for controlling a target vehicle control device from being outputted as the output signal to the target vehicle control device,
wherein the vehicle control includes at least one of a steering control, an engine control, a vehicle lamp control, a lane departure warning control, a collision avoidance control and a warning control.

2. The vehicle control system as set forth in claim 1, wherein the waiting time is preset according to the length of time from occurrence of the abnormality of the circuit configuration of the operation means until the abnormality is detected by the abnormality detection means.

3. The vehicle control system as set forth in claim 2, wherein the configuration data is comprised of a plurality of data blocks,
the operation means includes configuration recording means for recording therein the configuration data, which is recorded in the recording means, on a data block basis,
the abnormality detection means performs, for each of the data blocks of the configuration data recorded in the configuration recording means, a data block-based abnormality detection to detect whether an abnormality has occurred in the data block,
upon detection of the abnormality in any of the data blocks of the configuration data, the abnormality detection means determines that the abnormality of the circuit configuration of the operation means has occurred, and
the waiting time is preset to be longer than or equal to a required detection time which is a time required for the abnormality detection means to perform the data block-based abnormality detection for a predetermined number of the data blocks of the configuration data recorded in the configuration recording means.

4. The vehicle control system as set forth in claim 3, wherein the required detection time is a time required for the abnormality detection means to perform the data block-based abnormality detection for all the data blocks of the configuration data recorded in the configuration recording means.

5. The vehicle control system as set forth in claim 1, wherein the processing means is configured not to output the output signal when the abnormality detection result indicates that the abnormality of the circuit configuration of the operation means has been detected by the abnormality detection means.

6. The vehicle control system as set forth in claim 1, wherein the control system is configured to control a target device,
when the abnormality detection result indicates that no abnormality of the circuit configuration of the operation means has been detected by the abnormality detection means, the processing means outputs the target control signal for controlling the target device as the output signal to the target device, and
when the abnormality detection result indicates that the abnormality of the circuit configuration of the operation means has been detected by the abnormality detection means, the processing means outputs an abnormality signal as the output signal to the target device.

7. The vehicle control system as set forth in claim 6, wherein the target control signal and the abnormality signal are produced by the processing means according to the likelihood of the operation signal outputted from the operation means being correct.

8. The vehicle control system as set forth in claim 1, wherein the operation means is constituted of a programmable logic device that includes a configuration recording section for recording the configuration data and is capable of rewriting the configuration data recorded in the configuration recording section.

9. The vehicle control system as set forth in claim 1, wherein the abnormality detection means is included in the operation means.

10. The vehicle control system as set forth in claim 9, wherein at least two of the operation means, the processing means and the recording means are provided together on a single chip.

11. The vehicle control system as set forth in claim 10, wherein all of the operation means, the processing means and the recording means are provided together on the single chip.

12. A method of controlling a vehicle to provide a vehicle control based on objects detected in an environment of the vehicle, the method comprising:
detecting, by one or more sensors mounted on the vehicle, an object from an environment of the vehicle;
generating an input signal based on the object detected;
recording, by recording means, configuration data;
performing, by an operation means, arithmetic and logical operations on the input signal based on the object detected and outputting an operation signal indicative of a result of the operations, the operation means having a circuit configuration defined by the configuration data recorded in the recording means;
detecting, by an abnormality detection means, an abnormality of the operation means and outputting an abnormality detection result, the abnormality detection means having a maximum required detection time that is less than a preset waiting time;
acquiring, by processing means, the operation signal outputted from the operation means and acquiring the abnormality detection result from the abnormality detection means, producing an output signal based on the operation signal and outputting the output signal after the preset waiting time from the acquisition of the operation signal such that an abnormality of the operation means is detected by the abnormality detection means before the processing means outputs an output signal based on the abnormality of the operation means,
wherein in response to detecting an abnormality of the operation means, the processing means prevents a target vehicle control signal for controlling a target vehicle control device from being outputted as the output signal to the target vehicle control device;
receiving, by one or more vehicle control devices mounted on the vehicle, the output signal; and
performing the vehicle control based on the output signal, wherein the vehicle control includes at least one of a steering control, an engine control, a vehicle lamp control, a lane departure warning control, a collision avoidance control and a warning control.

* * * * *